United States Patent [19]
Kajita

[11] Patent Number: 5,497,018
[45] Date of Patent: Mar. 5, 1996

[54] SEMICONDUCTOR MEMORY DEVICE HAVING A FLOATING GATE WITH IMPROVED INSULATION FILM QUALITY

[75] Inventor: Tatsuya Kajita, Kawasaki, Japan

[73] Assignee: Fujitsu Limited, Kawasaki, Japan

[21] Appl. No.: 297,552

[22] Filed: Aug. 31, 1994

Related U.S. Application Data

[62] Division of Ser. No. 974,721, Nov. 13, 1992, Pat. No. 5,449,629.

[30] Foreign Application Priority Data

Nov. 14, 1991 [JP] Japan ..................... 3-299281

[51] Int. Cl.$^6$ ................................. H01L 29/788
[52] U.S. Cl. .......................... 257/316; 257/315
[58] Field of Search ..................... 257/316, 315, 257/326

[56] References Cited

U.S. PATENT DOCUMENTS

| | | | |
|---|---|---|---|
| 4,766,088 | 8/1988 | Kono et al. | 437/52 |
| 5,013,674 | 5/1991 | Bergemont | 437/43 |
| 5,066,992 | 11/1991 | Wu et al. | 257/316 |
| 5,081,054 | 1/1992 | Wu et al. | 437/43 |
| 5,089,433 | 2/1992 | Anand et al. | 437/43 |
| 5,104,819 | 4/1992 | Freiberger et al. | 437/43 |
| 5,188,976 | 2/1993 | Kume et al. | 437/43 |
| 5,225,361 | 7/1993 | Kakiuchi et al. | 437/43 |
| 5,242,850 | 9/1993 | Tasaka | 437/44 |
| 5,326,999 | 7/1994 | Kim et al. | 257/316 |

FOREIGN PATENT DOCUMENTS

| | | |
|---|---|---|
| 0287031A2 | 10/1988 | European Pat. Off. . |
| 0305741A2 | 3/1989 | European Pat. Off. . |
| 3107543A1 | 12/1981 | Germany . |
| 61-050371 | 7/1986 | Japan . |
| 63-62382 | 3/1988 | Japan . |
| 63-228670 | 9/1988 | Japan . |
| 63-255964 | 10/1988 | Japan . |
| 1-218061 | 8/1989 | Japan . |
| 2-25069 | 1/1990 | Japan . |
| 2-84776A | 3/1990 | Japan . |
| 2-308566A | 12/1990 | Japan . |
| 3-177064 | 8/1991 | Japan . |

Primary Examiner—Robert P. Limanek
Attorney, Agent, or Firm—Nikaido, Marmelstein, Murray & Oram

[57] ABSTRACT

A method for fabricating a flash-EPROM comprises the steps of forming a first gate insulation film and a second gate insulation film on a semiconductor substrate so as to respectively cover first and second device regions, providing a first conductor layer so as to cover both the first device region and the second device region, patterning the first conductor layer to form a floating gate electrode in correspondence to the first device region, oxidizing a surface of the first conductor layer to form a capacitor insulation film surrounding the floating gate electrode, providing a second conductor layer on the first conductor layer as to bury underneath the floating gate electrode covered by the capacitor insulation film, patterning the second conductor layer on the first device region to form a control gate electrode, exposing the first conductor layer in correspondence to the second device region, and patterning the first conductor layer remaining on the second element region to form a gate electrode of a peripheral transistor.

2 Claims, 12 Drawing Sheets

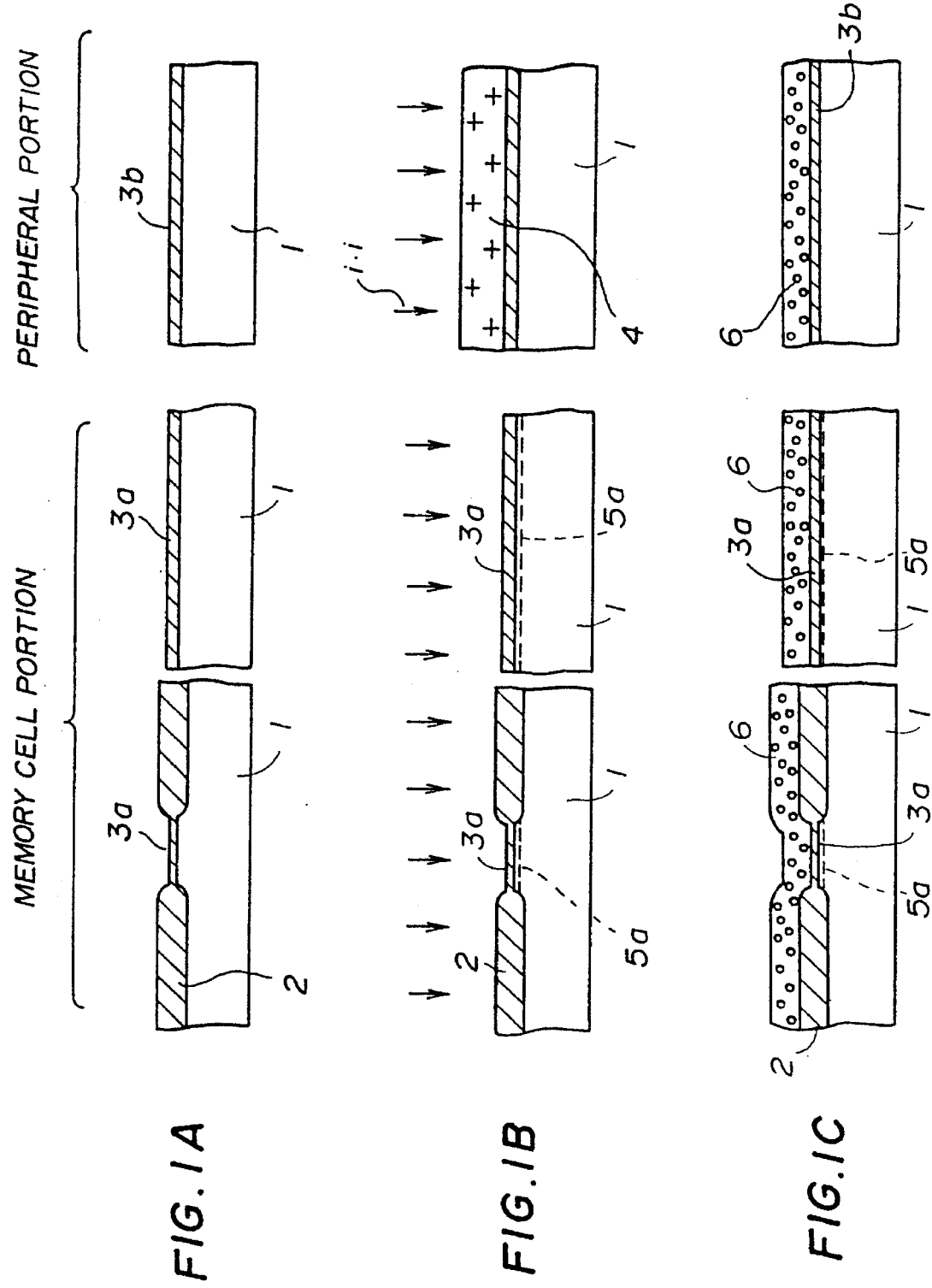

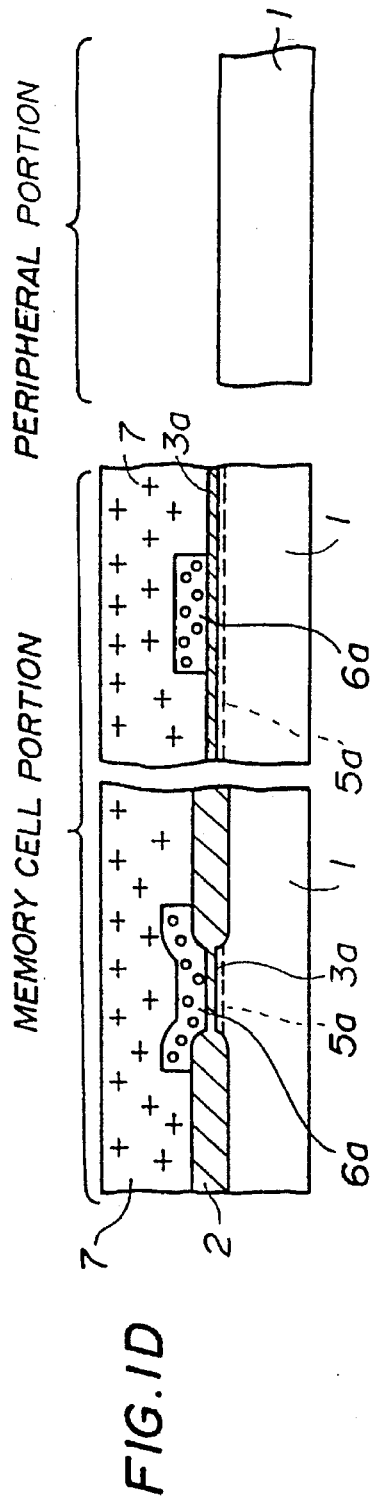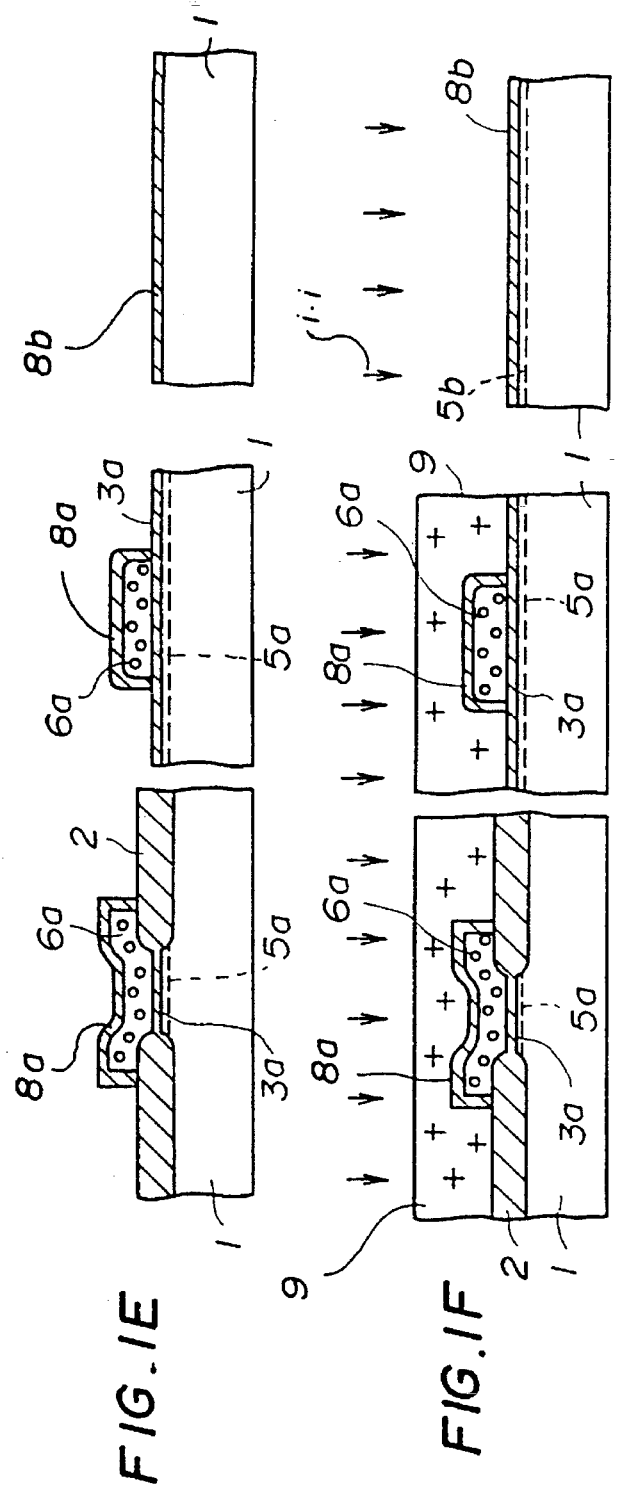
FIG.1D
FIG.1E
FIG.1F

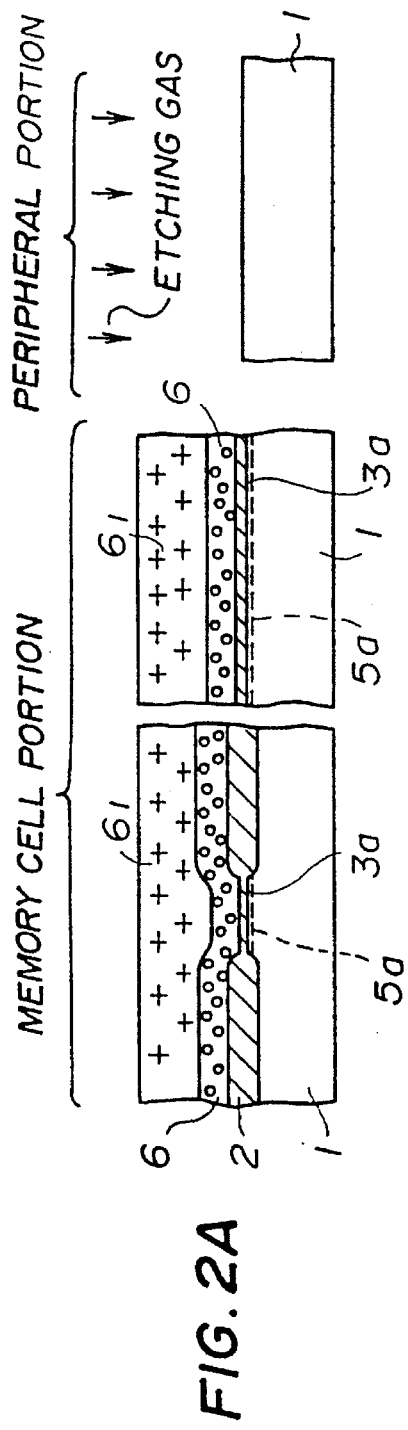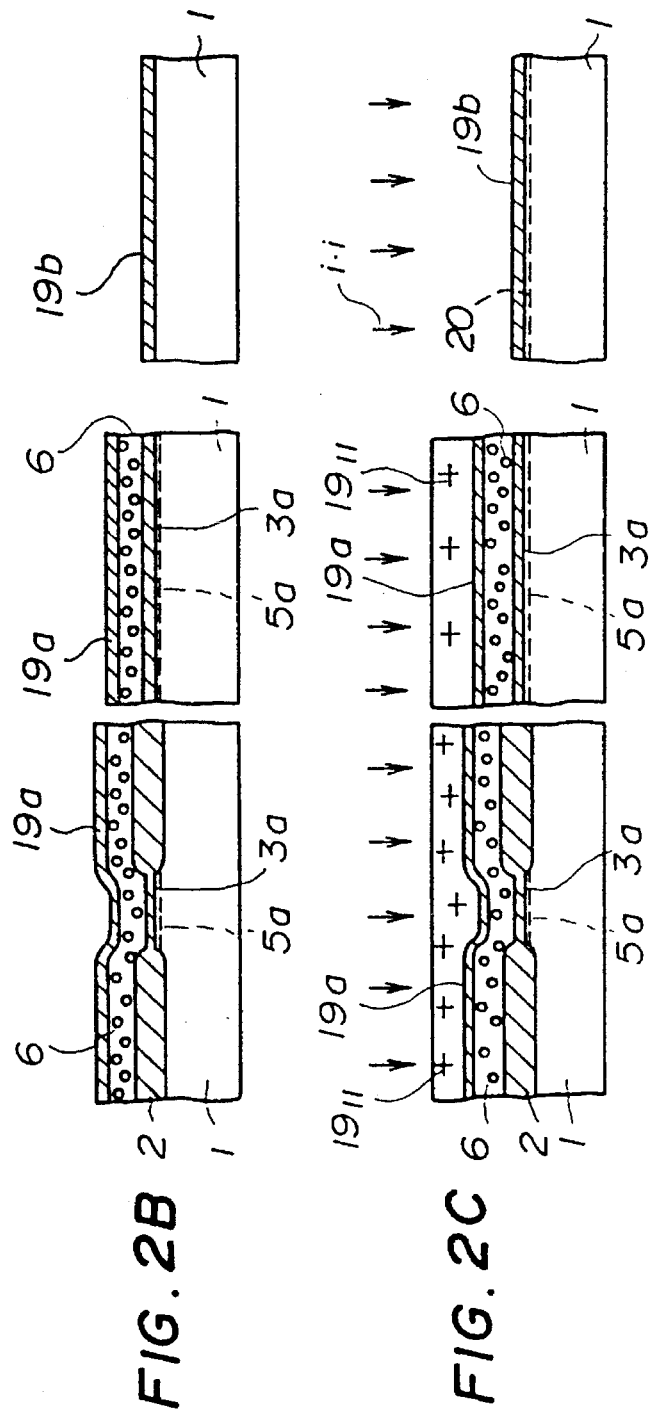
FIG. 2A
FIG. 2B
FIG. 2C

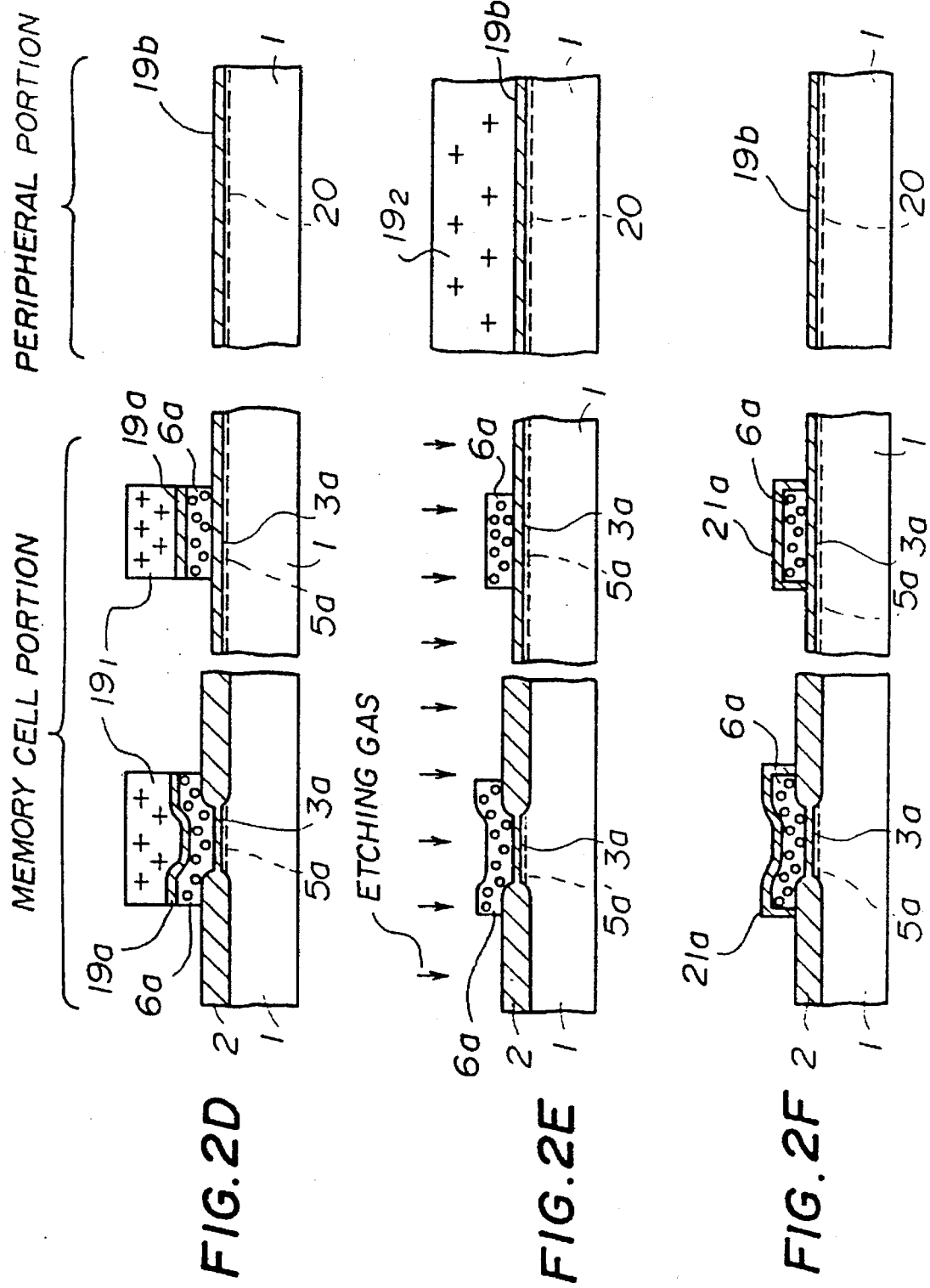

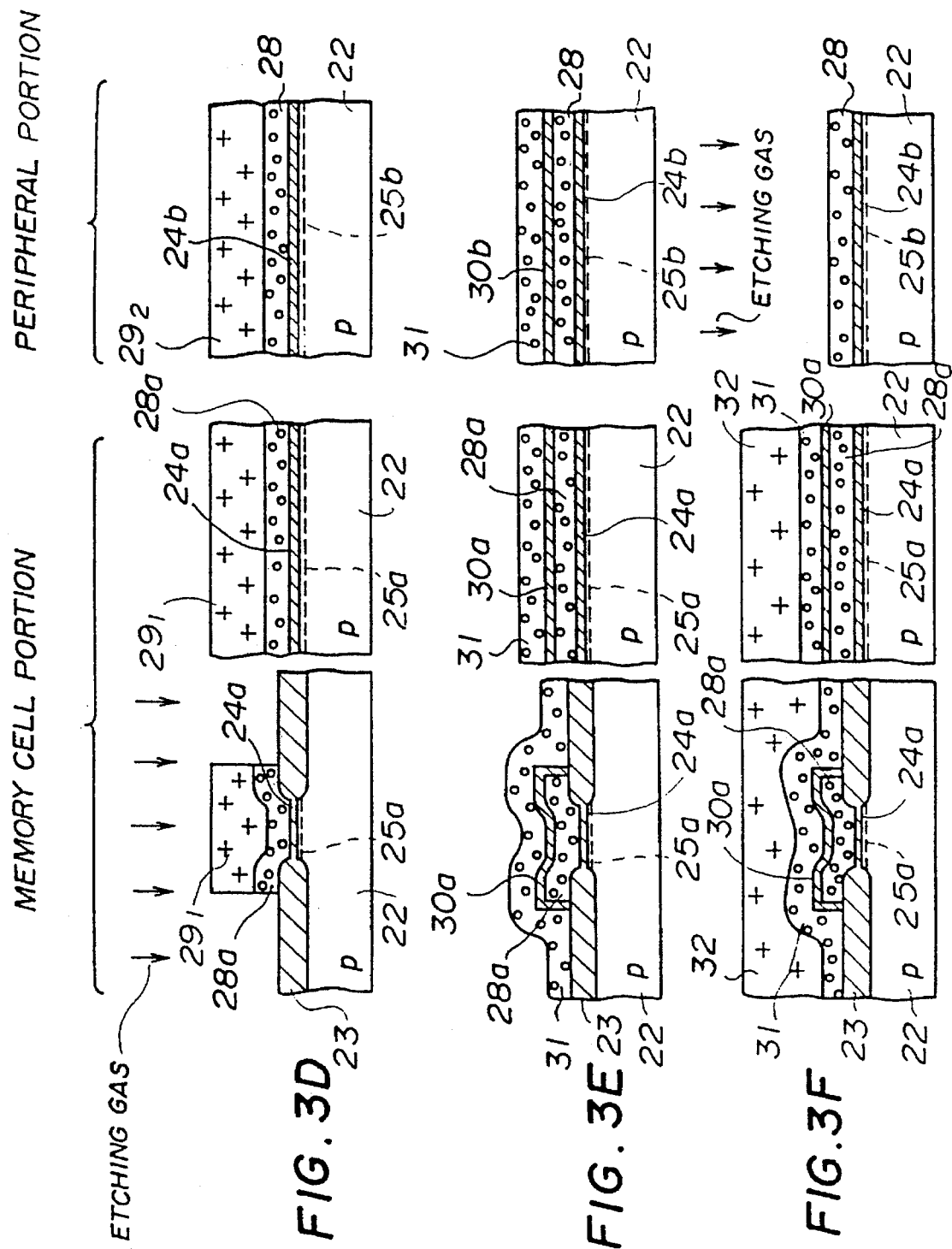

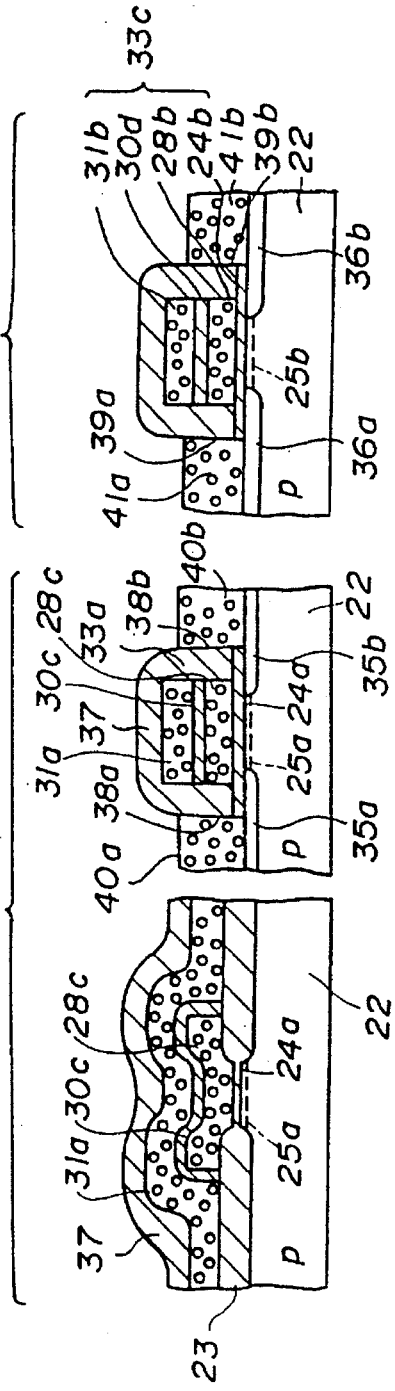
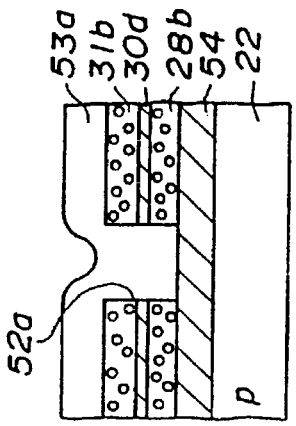
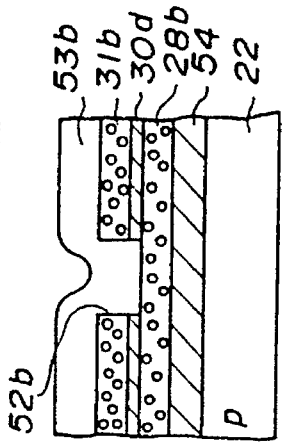
FIG. 7A
FIG. 7B
FIG. 7C

SEMICONDUCTOR MEMORY DEVICE HAVING A FLOATING GATE WITH IMPROVED INSULATION FILM QUALITY

This is a division of application Ser. No. 07/974,721 filed Nov. 13, 1992 now U.S. Pat. No. 5,449,629.

BACKGROUND OF THE INVENTION

The present invention generally relates to fabrication of semiconductor memory devices and more particularly to a method for fabricating a non-volatile semiconductor memory device having a floating gate electrode.

In relation to the storage device of computers, there is a continuous demand for a non-volatile semiconductor memory device having a large capacity for storing information. Particularly, the so-called flash-erasable EPROM or simply flash-EPROM has been studied intensively in recent years as an alternative of hard disk devices. In flash EPROMs, rewriting of data is possible similarly to the conventional random access memories, while the device can hold the written information even when the electrical power is turned off. Thus, the device is ideal for external storage device of computers such as hard disk. Further, application to the memory cards is studied. In relation to various applications of the flash-EPROM, intensive efforts are in progress to improve the reliability and life-time of the device as well as to reduce the cost of fabrication.

A flash-EPROM has a structure similar to the conventional MOS transistor and stores information in an insulated, floating gate in the form of electric charges. Particularly, the device called FLOTOX (floating gate, Tunnel Oxide) type or ETOX (EPROM Tunnel Oxide) type is characterized by a control gate provided on a floating gate with a separation therefrom by an capacitor insulation film. When writing information, hot electrons are injected into the floating gate electrode from a drain region formed in a semiconductor substrate via a gate insulation film located underneath the floating gate by the tunneling effect, wherein the tunneling effect is caused by applying a control voltage to the control electrode. Erasing of information, on the other hand, is carried out by causing a tunneling of electrons through the gate oxide film to dissipate the electrons into a source region also formed in the substrate. In order to facilitate the tunneling of electrons, the gate oxide film is formed to have a reduced thickness as compared with conventional MOS transistors.

In order to achieve an efficient control of the foregoing tunneling of electrons by the control gate, one has to secure a large ratio for the parameter $C_2/(C_1+C_2)$, wherein the term $C_1$ represents the capacitance formed between the floating gate electrode and the semiconductor substrate, while the parameter $C_2$ represents the capacitance that is formed between the floating gate electrode and the control gate electrode. The above requirement in turn imposes a requirement that the insulation film surrounding the floating gate be formed as thin as possible. Thereby, a process is required to form such an insulation film with improved quality. It will be noted that there should be no leak current flowing through the insulation film. In other words, it is critical to the successful operation of the flash-EPROM to form the insulation film that surrounds the floating gate as thin as possible and simultaneously with a high quality such that the insulation film is substantially free from impurities.

Conventionally, the flash-EPROM of the FLOTOX type has been fabricated according to the process shown in FIGS. 1(A)–1(I), wherein the device shown on the left side of the drawing represents the memory cell transistor in the cross sectional view taken along the gate-length direction (X-direction), while the device in the middle represents the same memory cell transistor taken in the gate-width direction (Y-direction). It should be noted that the memory cell transistor has a structure similar to a MOS transistor. On the other hand, the drawing shown on the right side represents a MOS transistor that is provided in a peripheral region as a peripheral device.

Referring to FIG. 1(A) at first, a field oxide film 2 is formed selectively on a silicon substrate 1 for device isolation by an oxidation process conducted in a wet $O_2$ environment while protecting the device region, on which a memory cell transistor or a peripheral transistor is to be formed, by means of a mask such as silicon nitride not illustrated. After removing the mask, a silicon oxide film 3a is formed by an oxidation process conducted in a dry $O_2$ environment, as a gate insulation film of the memory cell transistor to be formed in the memory cell region. Simultaneously, a silicon oxide film 3b is formed on the peripheral region.

Next, a first channel region 5a is formed as shown in FIG. 1(B) by an ion implantation process for controlling the threshold voltage of the MOS transistor forming the memory cell. Thereby, the peripheral region is masked with a photoresist 4, and the impurity element is injected selectively into the channel region via the gate insulation film 3a. It should be noted that the ion implantation of the impurity element should be conducted after the gate insulation film 3a is formed, as the thermal treatment associated with the formation of the gate insulation film 3a tends to cause a diffusion of the impurity elements into the interior of the substrate 1 or segregation of the impurity element at the interface between the gate insulation film 3a and the substrate 1, when the foregoing processes are reversed.

Next, a first polysilicon layer 6 is formed on the entire surface of the silicon substrate 1 as shown in FIG. 1(C), wherein it will be noted that the layer 6 forms the floating gate electrode of the flash-EPROM in the subsequent patterning process. Thus, in the step of FIG. 1(D), the first polysilicon layer 6 is patterned to form an isolated electrode pattern 6a corresponding to a gate electrode of the MOS transistor that forms the memory cell transistor. On the other hand, the first polysilicon layer 6 is removed from the peripheral region. Further, the memory cell region is protected by a resist 7 and the silicon oxide film 3b formed on the peripheral region is removed so that the Si substrate 1 is exposed.

Next, the photoresist 7 is removed and the structure of FIG. 1(D) is subjected to a thermal oxidation process conducted in a dry $O_2$ environment such that the electrode 6a is covered by a silicon oxide film 8a that acts later on as a capacitor insulation film. Simultaneously, a silicon oxide film 8b is formed in the peripheral region as shown in FIG. 1(E) as a gate insulation film of the peripheral MOS transistor to be formed. Thereby, the gate electrode 6a is covered by silicon oxide for the entirety thereof and is insulated from the surrounding. In other words, the electrode 6a forms a floating gate of the flash-EPROM.

After the silicon oxide film 8a is formed as above, an ion implantation process is conducted again to form a second channel region 5b for controlling the threshold voltage of the peripheral MOS transistor as shown in FIG. 1(F). Here, it should be noted that the memory cell transistor including the capacitor insulation film 8a of the floating gate 6a is covered by a resist 9 such that no ion implantation occurs in the memory cell region.

Next, the resist 9 is removed and a second polysilicon layer 10 is deposited on the entirety of the surface of the substrate 1 including the memory cell region and the peripheral region as indicated in FIG. 1(G), and the polysilicon layer 10 thus deposited is patterned as shown in FIG. 1(H) by using a resist pattern $10_1$ as a mask to form a control electrode 10a located above the floating gate electrode 6a. Further, the polysilicon layer 10 is patterned by using a resist pattern $10_2$ as a mask to form a gate electrode 10b of the peripheral MOS transistor.

Next, an ion implantation process is achieved for incorporating the impurity element into the substrate 1 in correspondence to the source and drain of the memory cell transistor as well as in correspondence to the source and drain of the peripheral transistor according to the self alignment process that uses the floating electrode 6a and the control electrode 10a in the memory cell region and the gate electrode 10b in the peripheral region as a mask. Thereby, diffusion regions 12a and 12b are formed as the source and drain of the memory cell transistor. Further, diffusion regions 13a and 13b are formed as the source and drain of the peripheral transistor.

Further, an inter-layer insulation film 14 is deposited on the entirety of the structure thus formed, and contact holes 15a and 15b are formed at both sides of a gate structure 11a that includes the floating electrode 3a and the control electrode 10a buried under the insulation film 14, to expose the upper major surface of the diffusion regions 12a and 12b. Similarly, contact holes 16a and 16b are formed in the insulation film 14 at both sides of a gate structure 11b that in turn includes the gate electrode 10b covered by the insulation film 14, to expose the upper major surface of the diffusion regions 13a and 13b. Further, a polysilicon layer is deposited to fill the contact holes 15a and 15b in the memory cell transistor and patterned to form a source electrode 17a and a drain electrode 17b. Simultaneously, the polysilicon layer fills the contact holes 18a and 18b in correspondence to the peripheral region to form a source electrode 13a and a drain electrode 13b. Thereby, the flash-EPROM is shown is completed as indicated in FIG. 1(I).

In the foregoing process of fabrication, it should be noted that the photoresist 9 contacts directly with the capacitor insulation film 8 in the step of FIG. 1(F). Thereby, a problem arises in that the capacitor insulation film 8a is contaminated by the impurities released from the resist 9, and such impurity elements causes a degradation in the quality of the insulation film 8a. Such a degradation of the capacitor insulation film causes various problems such as leaking of accumulated electric charges, degradation of the dielectric strength of the film 9a, and the like. Thereby, the operation of the flash-EPROM becomes unstable. Further, the lifetime of the device for repeated writing of information is deteriorated.

In order to avoid the foregoing problem, an alternative method is proposed to eliminate the contact between the capacitor insulation film 8a and the photoresist 9 as shown in FIGS. 2(A)–2(F), wherein the step of FIG. 2(A) follows the step of FIG. 1(C).

Referring to FIG. 2(A), a photoresist layer is deposited on the structure of FIG. 1(C) and patterned subsequently to form a resist pattern $6_1$ that exposes the upper major surface of the polysilicon layer 6 in correspondence to the peripheral region. Further, while using the resist pattern $6_1$ as a mask, the polysilicon layer 6 is subjected to a reactive ion etching process such that the upper major surface of the substrate 1 is exposed in correspondence to the peripheral region. Thereby, the structure shown in FIG. 2(A) is obtained.

After the resist pattern $6_1$ is removed, the structure of FIG. 2(A) is subjected to a thermal oxidation process to form a silicon oxide layer 19a such that the layer 19a covers the upper major surface of the polysilicon layer 6. Simultaneously, a silicon oxide layer 19b is formed on the exposed upper major surface of the substrate 1 in correspondence to the peripheral region. Thereby, a structure shown in FIG. 2(B) is obtained.

Next, a resist layer $19_{11}$ is provided on the upper major surface of the silicon oxide layer 19a in correspondence to the memory cell region and an ion implantation process is conducted such that impurity elements are introduced into the substrate 1 in correspondence to the peripheral region via the silicon oxide layer 19b. Thereby, a channel region 20 is formed as indicated in FIG. 2(C).

Further, the resist layer $19_{11}$ is patterned in a step of FIG. 2(D) to form a resist pattern $19_1$ in correspondence to the floating gate electrode to be formed on the memory cell region. Further, by conducting a reactive ion etching process while using the resist pattern $19_1$ as a mask, the polysilicon layer 6 is patterned together with the silicon oxide layer 19a formed thereon to form the polysilicon electrode 6a as shown in FIG. 2(D).

Next, the resist pattern $19_1$ is removed in the step 2(E) and the silicon oxide film 19a on the patterned polysilicon electrode 6a is removed by the reactive ion etching process while protecting the silicon oxide film 19b on the peripheral region by another resist pattern $19_2$. After the resist pattern $19_2$ is removed and the polysilicon electrode 6a exposed, the structure of FIG. 2(E) is subjected to a thermal oxidation process to form a silicon oxide film 21a such that the film 21a covers the entirety of the electrode 6a as indicated in FIG. 2(F). Thereby, the electrode 6a forms the floating gate electrode.

After the step of FIG. 2(F), the process of FIG. 1(G) is conducted to cover the floating gate electrode 6a by the polysilicon layer 10. Further, by applying the processes already described with reference to FIGS. 1(H) and 1(I), one obtains the flash-EPROM as shown in FIG. 1(I).

In the foregoing alternative process, it will be noted that the polysilicon layer 10 covers the capacitor insulation film 6a directly and immediately when the film 6a is formed by the thermal oxidation process. Thereby, the problem of the photoresist contacting with the critical capacitor insulation film 6a is eliminated.

On the other hand, the foregoing alternative process has a problem in that there occurs a growth of the insulation film 19b in the step of FIG. 2(F). It should be noted that the insulation film 19b is formed in the oxidation step of FIG. 2(D), and the oxidation process achieved in the step of FIG. 2(F) increases the thickness of the film 19b. Thereby, the threshold voltage of the peripheral MOS transistor formed in the peripheral region tends to deviate from the desired value. It should be noted that the insulation film 19 acts as the gate insulation film of the peripheral MOS transistor and the variation in the thickness of the film 19b is critical to the threshold characteristics of the peripheral MOS transistor.

SUMMARY OF THE INVENTION

Accordingly, it is a general object of the present invention to provide a novel and useful process for fabricating a flash-EPROM wherein the foregoing problems are eliminated.

Another and more specific object of the present invention is to provide a process for fabricating a flash-EPROM wherein the contact between the capacitor insulation film that covers the floating gate of the flash-EPROM and the photoresist is eliminated for improving the quality of the capacitor insulation film.

Another object of the present invention is to provide a process for fabricating a flash-EPROM wherein a precise control of the threshold characteristics is achieved for the peripheral MOS transistors.

Another object of the present invention is to provide a process for fabricating a flash-EPROM comprising a memory cell transistor and a peripheral transistor respectively on a first device region and a second device region defined on a semiconductor substrate, said memory cell transistor including a floating gate electrode insulated by a capacitor insulation film and a control gate electrode provided on said floating gate electrode with a separation therefrom by said capacitor insulation film, said peripheral transistor including a gate electrode, said method comprising the steps of: forming a first gate insulation film and a second gate insulation film on said semiconductor substrate so as to respectively cover said first and second device regions; providing a first conductor layer so as to cover both said first device region covered with said first gate insulation film and said second device region covered with said second gate insulation film; patterning said first conductor layer so as to form said floating gate electrode on said first gate insulation film, said step of patterning being conducted such that said first conductor layer remaining on said second gate insulation film; oxidizing a surface of said first conductor layer so as to form said capacitor insulation film such that said capacitor insulation film covers said floating gate electrode; providing a second conductor layer on said first conductor layer so as to bury said capacitor insulation film underneath; patterning said second conductor layer on said first device region to form said control gate electrode; exposing said first conductor layer in correspondence to said second device region; and patterning said first conductor layer remaining on said second element region to form said gate electrode of said peripheral transistor. According to the present invention, the step for forming the second conductor layer is carried out immediately after the step of forming the capacitor insulation film, and thus the capacitor insulation film is protected by the second conductor layer from any external contamination. Thereby, the quality of the capacitor insulation film is improved and a reliable operation of the flash-EPROM is achieved even when the thickness of the capacitor insulation film is reduced substantially. Further, the second gate insulation film formed in the second device region is protected, by the first conductor layer, from oxidation or etching and an excellent control of the film thickness is achieved for the second insulation film. Thereby, one can control the threshold characteristics of the peripheral transistor exactly at the desired value. In addition, the process of the present invention provides a feature in that no additional heat treatment is applied to the device after the capacitor insulation film is formed. It should be noted that the second gate insulation film acting as a gate electrode of the peripheral transistor is already formed in the step of forming the first insulation film of the memory cell transistor. Thereby, the degradation of quality of the capacitor insulation film and the first insulation film due to excessive heat treatment is eliminated, and the operational characteristics of the device is substantially stabilized.

Other objects and further features of the present invention will become more apparent from the following detailed description when read in conjunction with the accompanying drawings.

BRIEF DESCRIPTION OF THE DRAWINGS

FIGS. 1(A)–1(I) are diagrams showing a typical conventional fabrication process of a flash-EPROM;

FIGS. 2(A)–2(F) are diagrams showing an alternative fabrication process of a flash-EPROM FIGS. 3(A)–3(I) are diagrams showing a fabrication process of a flash-EPROM according to a first embodiment of the present invention;

FIGS. 7(A)–7(C) are diagrams showing a fabrication process of a flash-EPROM according to a fourth embodiment according to the present invention.

DETAILED DESCRIPTION OF PREFERRED EMBODIMENTS

Figure 1G:
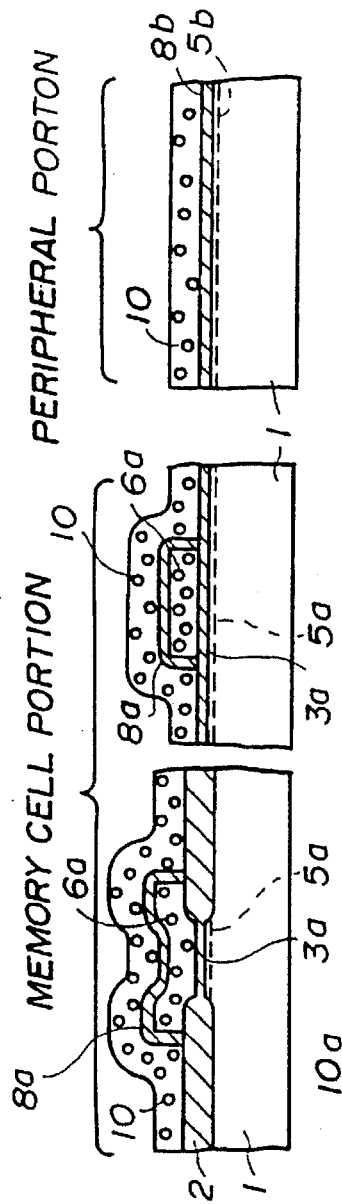
Figure 1H:
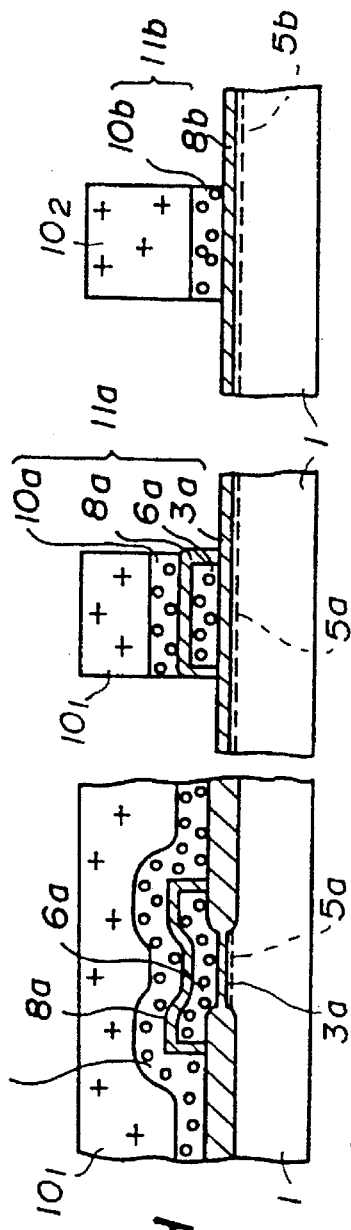
Figure 1I:
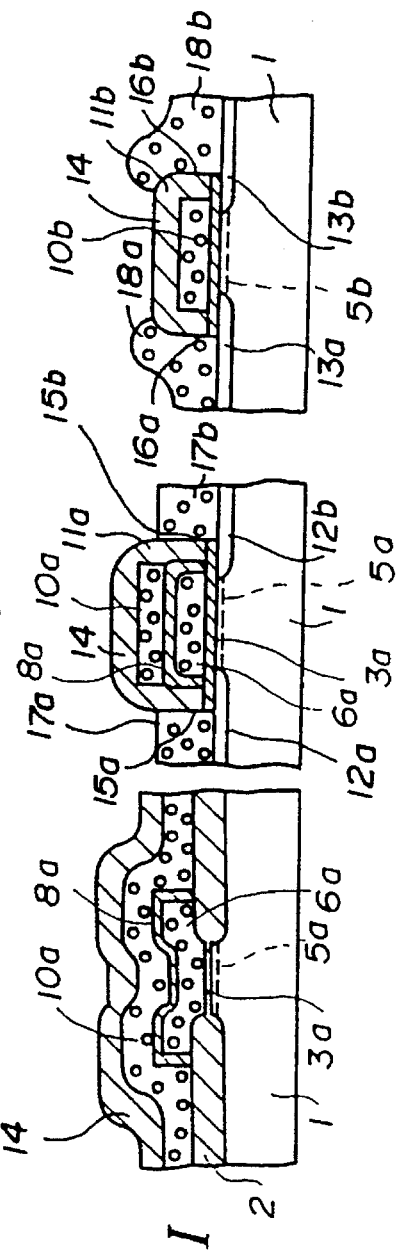
Figure 3A:
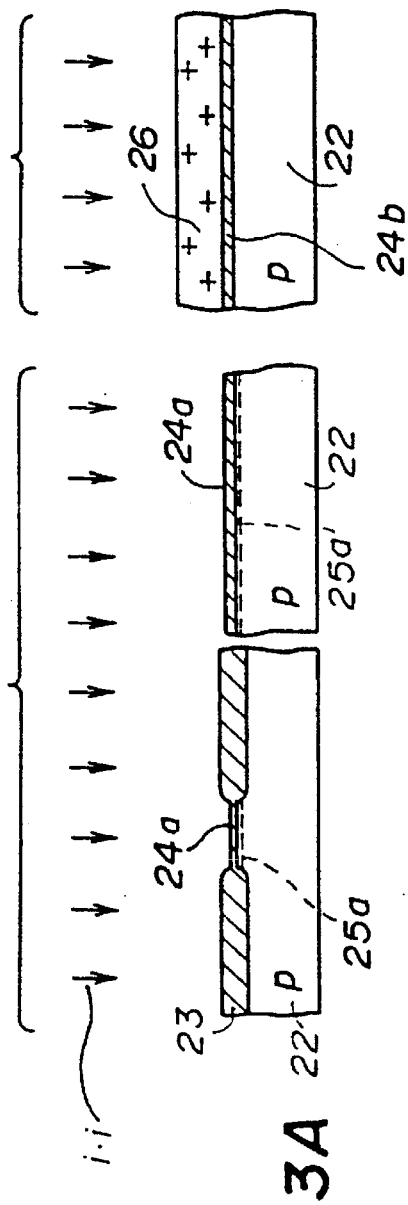
Figure 3B:
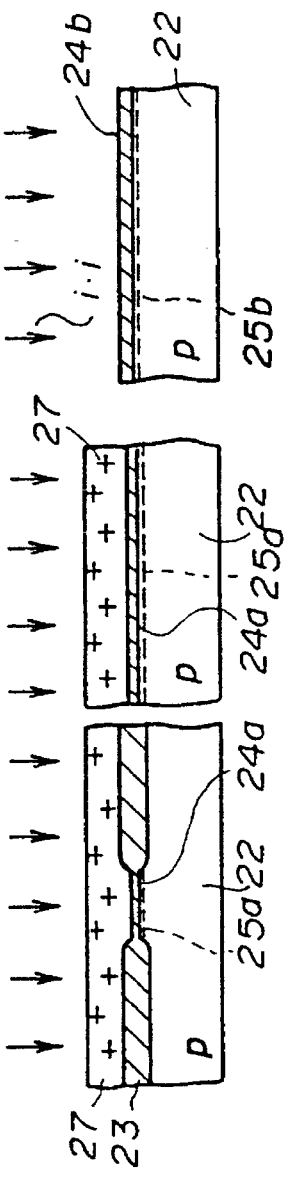
Figure 3C:
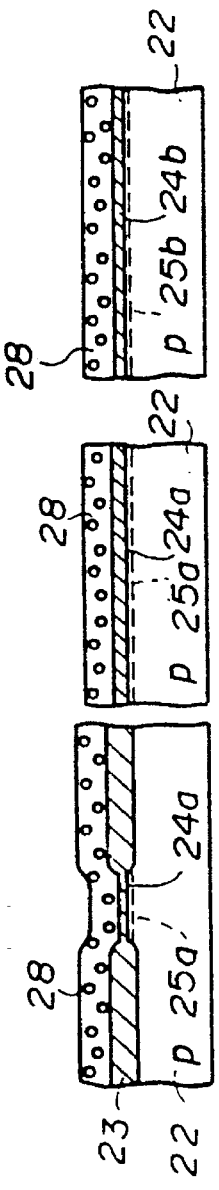
Figures 3G, 3H, 3I:
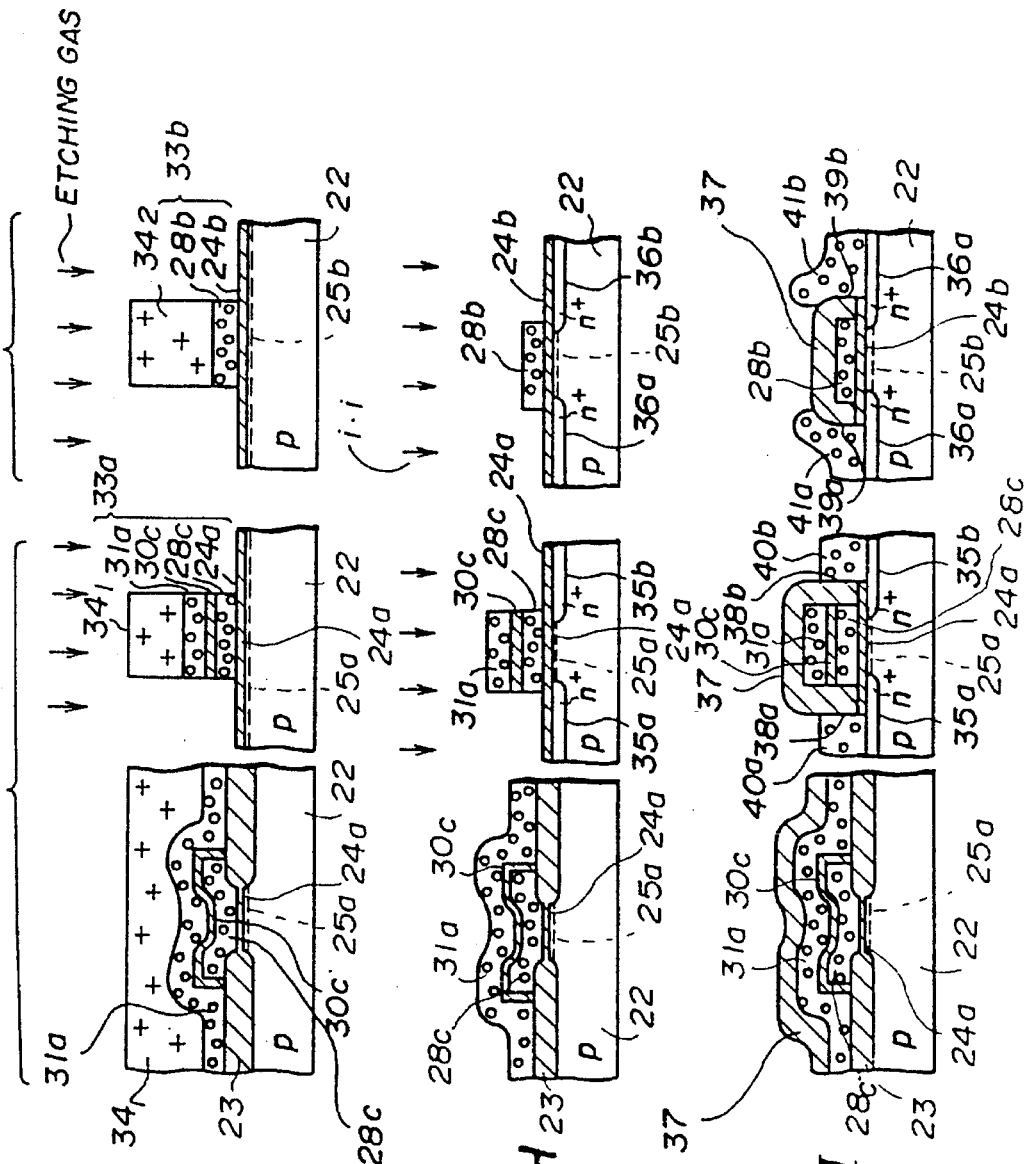
Figure 4A:
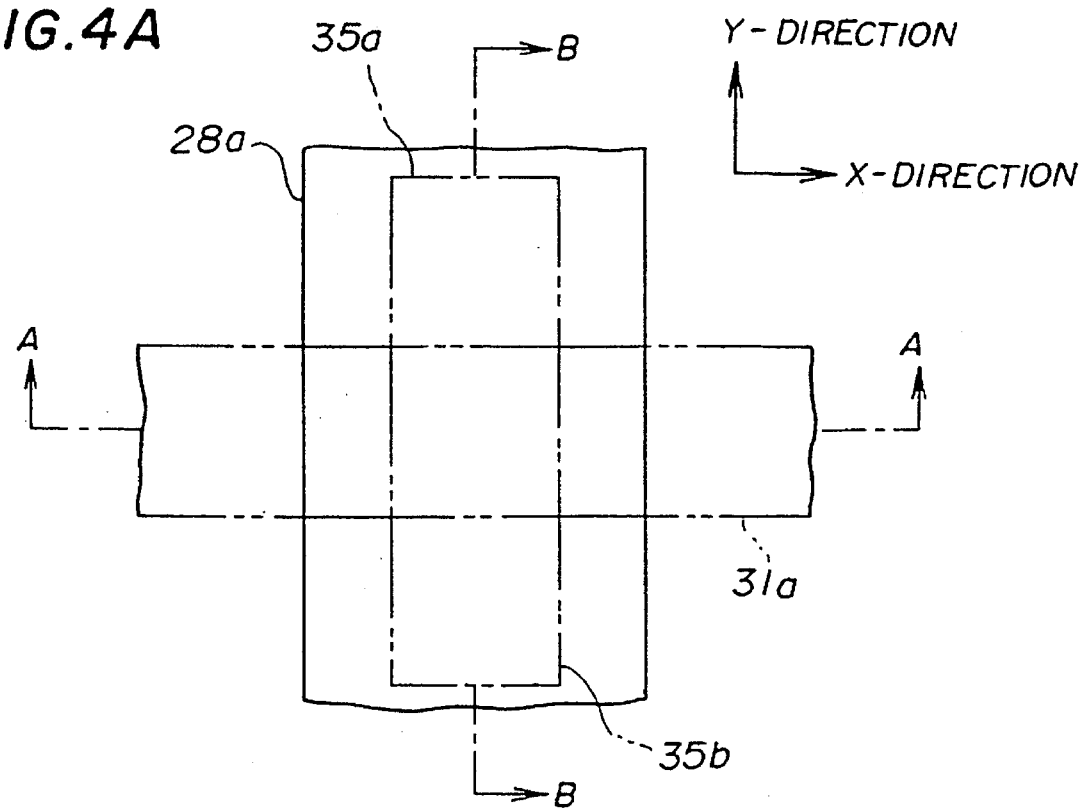
FIGS. 4(A) and 4(B) are diagrams showing a memory cell transistor and a peripheral transistor of the flash-EPROM fabricated according to the first embodiment of the present invention in a plan view.
Figure 4B:
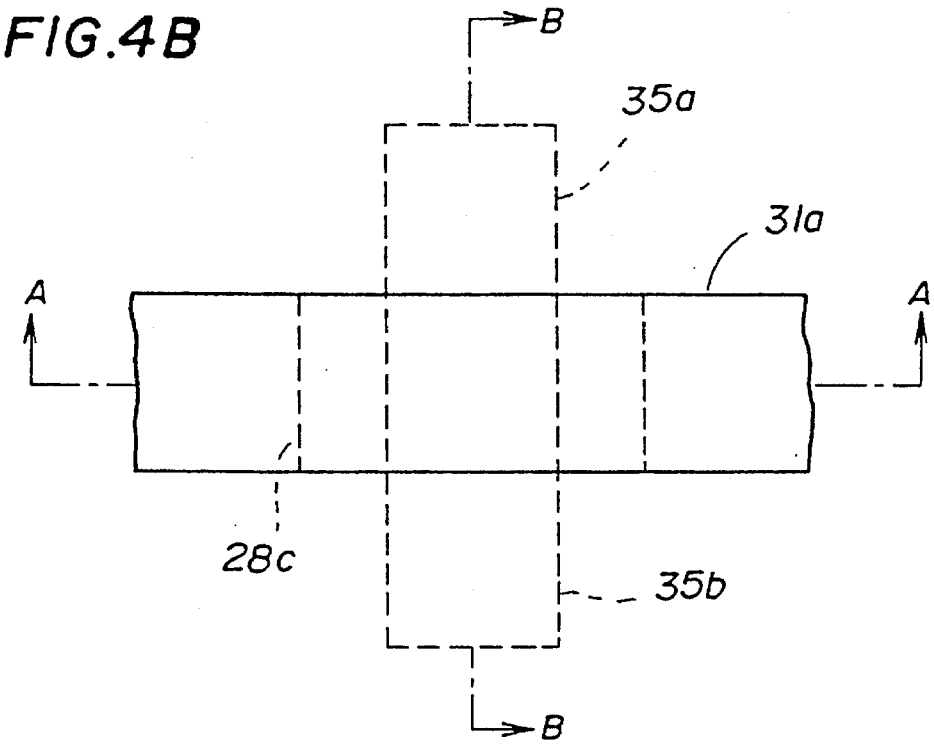

FIGS. 3(A)–3(I) show the fabrication process of a flash-EPROM of the so-called FLOTOX or ETOX type according to a first embodiment of the present invention, wherein the device shown on the left side represents a memory cell transistor formed in correspondence to a memory cell region in a cross sectional view taken along a direction connecting the source and drain of the memory cell transistor, while the device shown in the middle represents the same memory cell transistor taken along a cross section perpendicular to the representation at the left side thereof. Further, the device at the right represents a MOS transistor forming a part of the peripheral circuit in a cross section taken along the direction connecting the source and drain thereof. Further, FIGS. 4(A) and 4(B) represents the memory cell transistor in a plan view. There, it will be noted that FIGS. 4(A) and 4(B) represent the memory cell transistor formed in the steps of FIGS. 3(D) and 3(G), wherein the illustration at the left of FIG. 3(D) shows the memory cell transistor of FIG. 4(A) in the cross section taken along the line A—A while the drawing at the middle of FIG. 3(D) shows same device in the cross section taken along the line B—B. Similarly, the drawing at the left of FIG. 3(G) shows the memory cell transistor of FIG. 4(B) in the cross section taken along the line A—A while the drawing at the middle shows the same device in the cross section taken along the line B—B. In FIGS. 4(A) and 4(B), diffusion regions 35a and 35b not yet formed are illustrated for facilitating the understanding.

Referring to FIG. 3(A) first, a field oxide region 23 is formed in the wet $O_2$ environment with a thickness of 4000–6000 Å, selectively in correspondence to the isolation region defined on a silicon substrate 22 that is doped to the p-type, while protecting the device region for the memory cell transistor and the peripheral transistor by a mask such as a silicon nitride film. Next, the protective mask is removed from the device region of the memory cell transistor and a silicon oxide film 24a is grown in correspondence to the device region on which the memory cell transistor is to be formed, with a thickness of about 100 Å. Further, a silicon oxide film 24b is formed in correspondence to the device region of the peripheral transistor with a thickness of 100–300 Å after removing the protective film from the peripheral device region. There, the silicon oxide film 24a acts as a gate insulation film of the memory cell transistor, while the silicon oxide film 24b acts as a gate insulation film of the peripheral transistor. As the silicon oxide films 24a and 24b are formed separately from each other, one can form the silicon oxide films 24a and 24b with different thicknesses such that the film 24a has a smaller thickness as compared with the oxide film 24b. Of course, one can reverse the order of formation of the oxide films 24a and 24b. Further, it is possible to form the oxide films 24a and 24b simultaneously.

After the silicon oxide films 24a and 24b are formed, the device region for the peripheral transistor is protected by a resist 26, and an ion implantation process of p-type dopant such as B is conducted into the substrate 22 selectively through the silicon oxide film 24a to form a channel region 25 with a thickness of 0.1–0.2 µm for controlling the threshold voltage of the memory cell transistor to be formed thereon. Typically, a dose of $1 \times 10^{12}$–$1 \times 10^{13}$ $cm^{-2}$ is employed with an acceleration energy of 40–60 eV. The dose and the conductivity type of the impurity element are of course changed depending on whether the transistor is formed to be the depletion type or accumulation type.

Next, in a step of FIG. 3(B), a second channel region 25b is formed in the substrate 22 in correspondence to the device region of the peripheral transistor for controlling the threshold voltage thereof, by conducting an ion implantation of B with a dose of $1 \times 10^{12}$–$1 \times 10^{13}$ $cm^{-2}$. During this process, the device region of the memory cell transistor is protected by a resist 27. Thereby, the second channel region 25b is formed with a thickness of about 0.1–0.2 µm similarly to the channel region 25a.

Next, the resist 27 is removed from the structure of FIG. 3(B) and a first polysilicon layer 28 is deposited on the structure thus obtained at a temperature of 600°–700° C. as shown in FIG. 3(C) with a thickness of about 1500 Å. On the other hand, one may use amorphous silicon in place of polysilicon when forming the layer 28. In this case, the deposition temperature is set to 400°–600° C. In the description below, the phrase polysilicon is used for composition of the layer 28 in the sense that the phrase also includes amorphous silicon.

After the step of FIG. 3(C), the polysilicon layer 28 is patterned in correspondence to the memory cell region by using a patterned resist $29_1$ while protecting the peripheral region by a resist $29_2$. Thereby, a polysilicon pattern 28a is formed as indicated in FIG. 3(D) and also as indicated in the plan view of FIG. 4(A).

Next, the resist $29_1$ as well as the resist $29_2$ are removed and the structure thus obtained is subjected to a thermal oxidation process conducted at about 900°–1100° C. in a HCl environment. Thereby, a silicon oxide film 30a develops to cover the polysilicon pattern 28a typically with a thickness of 200–300 Å as indicated in FIG. 3(E), and the silicon oxide film 30a thus formed acts as a capacitor insulation film of the floating gate that characterizes the memory cell transistor of the flash-EPROM as will be described later. Simultaneously, a silicon oxide film 30b is formed on the upper major surface of the polysilicon layer 28 in correspondence to the peripheral device region. After the silicon oxide film 30a is formed as such, a polysilicon layer 31 is deposited immediately to bury the polysilicon pattern 28a underneath. Thereby, the silicon oxide film 30a is protected by the polysilicon layer 31 from any contamination.

It should be noted that the capacitor insulation film 30a may have a laminated structure of two or three layers overlapping each other on the silicon oxide film formed in the foregoing thermal oxidation process. In this case, a silicon nitride film is deposited on the silicon oxide film by a CVD process conducted at 700°–800° C. with a thickness of about 100–200 Å. Further, another silicon oxide film is formed on the silicon nitride film by a thermal oxidation process conducted at about 900°–1000° C. in the wet $O_2$ environment with a thickness of about 10– 50 Å. As a result of the use of such a laminated structure for the capacitor insulation film, one can improve the reliability of the capacitor insulation film significantly. It should be noted that silicon oxide film formed directly on a polysilicon layer tends to become fragile due to the effect of grain boundary existing in polysilicon, and this problem becomes conspicuous particularly when the thickness of the silicon oxide film is reduced as in the present case. Thereby, there can occur defects such as pinholes in the thin silicon oxide film. The embodiment avoids this problem by covering the silicon oxide film by a silicon nitride film and further by forming a stable silicon oxide film on the silicon nitride by subjecting the structure in a thermal oxidation process conducted in the wet $O_2$ environment.

After the step of FIG. 3(E), the polysilicon layer 31 is covered by a resist 32 in correspondence to the memory cell region while the layer 31 is exposed in correspondence to the peripheral region, and the exposed polysilicon layer 31 is removed selectively by a reactive ion etching process. Further, the silicon oxide layer 30b located underneath the polysilicon layer 31 is removed as shown in FIG. 3(F). Thereby, it should be noted that the silicon oxide film 30a is protected by the polysilicon layer 31 that in turn is protected by the resist 32. In other words, no contact occurs between the oxide film 30a and the photoresist 32.

Next, the resist 32 is removed from the structure of FIG. 3(F) thus obtained and another resist is applied thereon. Further, the resist thus applied is patterned to form a first resist pattern $34_1$ formed in correspondence to the gate structure of the memory cell transistor and a second resist pattern $34_2$ formed in correspondence to the gate structure of the peripheral transistor. Further, by using the resist patterns $34_1$ and $34_2$ as the mask, the polysilicon layer 31 as well as the layers 28a and 31 located below the layer 31 and the polysilicon layer 28 are patterned by a reactive ion etching process. As a result, a gate structure including a gate electrode 28c and a polysilicon gate electrode 31a is formed in correspondence to the memory cell transistor with a separation from each other by a silicon oxide film 30c. Further, a gate electrode 28b is formed in correspondence to the gate of the peripheral transistor. See the structure of FIG. 3(G).

Next, in the step of FIG. 3(H), an ion implantation of P or As is achieved into the substrate in correspondence to both the memory cell region and the peripheral device region while using the gate structure as a mask, with a dose of $1 \times 10^{15}$–$1 \times 10^{16}$ $cm^{-2}$. Thereby a source region 35a and a drain region 35b both of the $n^+$-type are formed in the substrate 22 at both sides of the gate structure of the memory cell transistor. Similarly, a source region 36a and a drain region 36b both of the $n^+$-type are formed in the substrate 22 at both sides of the gate structure of the peripheral transistor.

Further, the structure of FIG. 3(H) is covered by a PSG film 37 having a thickness of 4000–8000 Å, and contact holes 38a, 38b, 39a and 39b are formed in the PSG film 37 respectively in correspondence to the regions 35a, 35b, 36a and 36b by a reactive ion etching process. Further, a polysilicon layer is deposited on the structure thus obtained such that the polysilicon fills the contact holes 38a–39b, and the polysilicon layer thus deposited is patterned subsequently to form electrodes 40a, 40b, 41a and 41b respectively as source and drain electrodes of the memory cell transistor and source and drain electrodes of the peripheral transistor as shown in FIG. 3(I). Thereby, the flash-EPROM is completed.

In the structure of FIG. 3(I), it will be noted that the polysilicon pattern 28c acts as a floating gate surrounded by the gate insulation film 24a as well as by the capacitor insulation film 30c, while the polysilicon pattern 28b acts as a usual gate electrode of the peripheral MOS transistor. As is well known in the art, the carriers are removed from the floating gate 28c to the source region 35a by causing a tunneling through the gate insulation film 24a upon application of a source voltage to the source electrode 40a. For this purpose, the gate insulation film 24a has a reduced thickness as compared with the gate insulation film 24b as usual in the flash-EPROM and as already noted.

According to the process described above, the polysilicon layer 31 covers the structure of the memory cell region immediately when the silicon oxide film 30a is formed. Thereby, the contamination of film 30a acting as the capacitor insulation film is avoided and a reliable operation of the device is achieved even when the thickness of the film 30a is reduced to the order of 200–300 Å as described above. Associated with the reduced thickness of the capacitor insulation film, the degree of capacitor coupling between the control electrode 31a and the floating gate electrode as represented by the equation $C_2/(C_1+C_2)$ is increased and an efficient operation of the device is achieved. Further, it should be noted that the foregoing process allows the exact control of thickness of the first and second gate insulation films 24a and 24b, as the critical part of the films 24a and 24b are covered by the polysilicon layer 28 or polysilicon pattern 28a and 28b in the early stage of the fabrication process. For example, in the step of FIG. 3(E) to form the silicon oxide film 30a, the films 24a and 24b are already protected under the polysilicon patterns 28a and 28b. Thereby, one can reduce the thickness of the gate insulation film 24a in particular and the efficiency of injection of the carriers into the floating gate electrode 28c is substantially improved. Further, such a stability in the layer thickness of the gate insulation films 24a and 24b results in an improved distribution profile of impurity elements in the channel regions 25a and 25b.

In the foregoing process, it should be noted that step of FIG. 3(D) for defining the gate width and the step of FIG. 3(G) for defining the gate length may be reversed. Further, the patterning processes of FIG. 3(G) for patterning the polysilicon layer 31 to form the control gate electrode 31a in the memory cell region and to form the gate electrode 24b in the peripheral region are not necessarily be conducted concurrently but may be achieved separately such that the control electrode 31a is formed before the gate electrode 24b or vice versa. Further, one may leave the polysilicon layer 31 as well as the silicon oxide layer 30b unetched in the peripheral region in the step of FIG. 3(F) and conduct the patterning of the control gate electrode 31a and the underlying layers 30c and 28c shown in FIG. 3(G). After this, the remaining polysilicon layer 31 as well as the silicon oxide layer 30b are removed from the peripheral region to expose the first polysilicon layer 28 as shown in the illustration at the right of FIG. 3(F) and the patterning process for forming the polysilicon gate 28b is conducted similarly to the illustration at the right of FIG. 3(G). Alternatively, one may pattern the polysilicon layer 31 in the step of FIG. 3(F) in correspondence to the memory cell region and remove concurrently the polysilicon layer 31 as well as the underlying silicon oxide layer 30b from the peripheral region. After this, the exposed polysilicon layer 28 is patterned in the peripheral region to form the gate electrode 28b while patterning the floating gate electrode 28c concurrently. Thus, it will be understood that there can be various different sequences to form the structure of FIG. 3(H) once the second polysilicon layer 31 is deposited in the step of FIG. 3(E). In addition, it will be noted that the capacitor insulation film 30c is patterned while using the patterned control electrode 31a as a self-alignment mask.

Figure 5A:
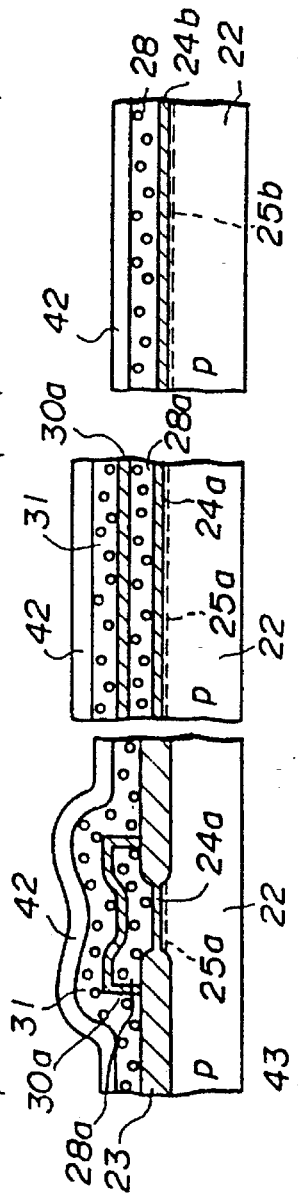
FIGS. 5(A)–5(C) are diagrams showing a fabrication process of a flash-EPROM according to a second embodiment of the present invention.
Figure 5B:
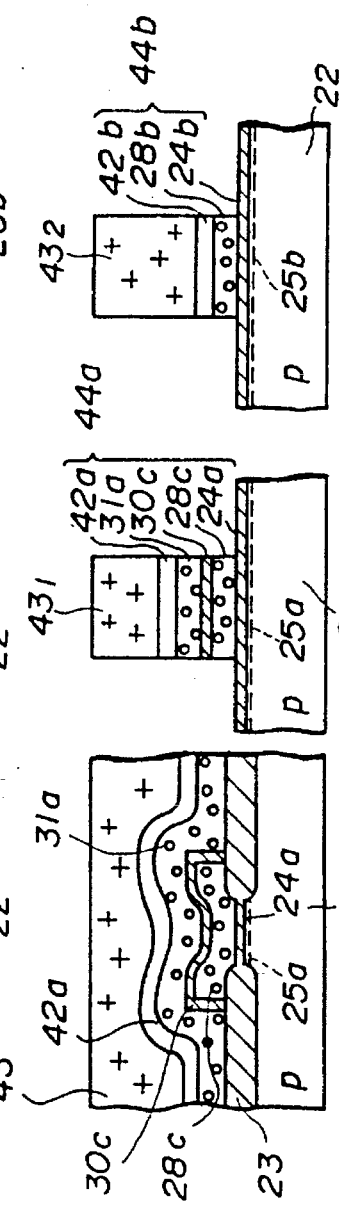
Figure 5C:
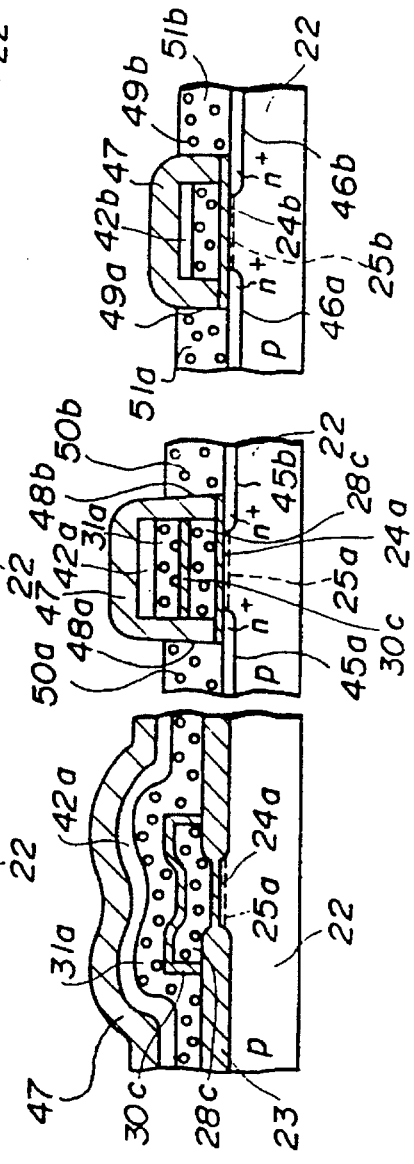

Next, a second embodiment of the present invention will be described with reference to FIGS. 5(A)–5(C), wherein the illustration at the left and middle represent the fabrication process of the memory cell transistor, while the illustration at the right represents the fabrication process of the peripheral transistor similarly to the diagrams shown in FIGS. 3(A)–3(I). In FIGS. 5(A)–5(C), the process represented in these drawings are conducted after the step of FIG. 3(E). In other words, the steps shown in FIGS. 5(A)–5(C) replaces the steps of FIGS. 3(F)–3(I).

Referring to FIGS. 5(A)–5(C), a layer 42 of a refractory conductor such as WSi or TiSi is deposited on the polysilicon layer 31 in the step of FIG. 5(A) by using a CVD or PVD process with a thickness of about 2000 Å in correspondence to the memory cell region. Simultaneously, the layer 42 is deposited to cover the polysilicon layer 28 in correspondence to the peripheral device region. Next, a resist 43 is deposited on the layer 42 and patterned subsequently to form a resist pattern $43_1$ and a resist pattern $43_2$, and the layered structure located underneath the layer 42 is patterned while using the resist patterns $43_1$ and $43_2$ as a mask as shown in FIG. 5(B). In the structure of FIG. 5(B), it will be noted that the layer 42 is patterned into a conductor pattern 42a in correspondence to the memory cell transistor while the same layer 42 is patterned to form a conductor pattern 42b in correspondence to the peripheral transistor. There, the conductor pattern 42a covers the polysilicon control gate electrode 31a while the conductor pattern 42b covers the gate electrode 28b.

Next, the resist patterns $43_1$ and $43_2$ are removed from the structure of FIG. 5(B) and an ion implantation process is conducted to form a source region 45a and a drain region 45b in correspondence to the memory cell transistor as well as to form a source region 46a and a drain region 46b in correspondence to the peripheral transistor. Further, a PSG film 47 corresponding to the PSG film 37 is deposited on the structure thus obtained in the step of FIG. 5(C). Further, contact holes 48a and 48b are formed in the PSG film 47 in correspondence to the source and drain regions of the memory cell transistor, and contact holes 49a and 49b are formed in the PSG film 47 in correspondence to the source and drain regions of the peripheral transistor. Further, the contact holes 48a–49b are filled by polysilicon electrodes 50a–51b similarly to the step of FIG. 3(I).

According to the present embodiment, the polysilicon electrodes 31a and 28b are shunted by the low resistivity refractory polycide 42, and one can reduce the impurity concentration level in the polysilicon electrodes without inviting degradation in the operational characteristics of the flash-EPROM device. With the reduced impurity concentration level, it is possible to reduce the chance of the capacitor insulation film 30c being contaminated by the impurity elements doped into the polysilicon layer 31.

Next, a third embodiment of the present invention will be described with reference to FIGS. 6(A)–6(C). Similarly to the previous drawings, the illustration at the left and middle represent the memory cell transistor in two, mutually perpendicular cross sections, while the illustration at the right shows the peripheral transistor.

Figures 6A, 6B, 6C:
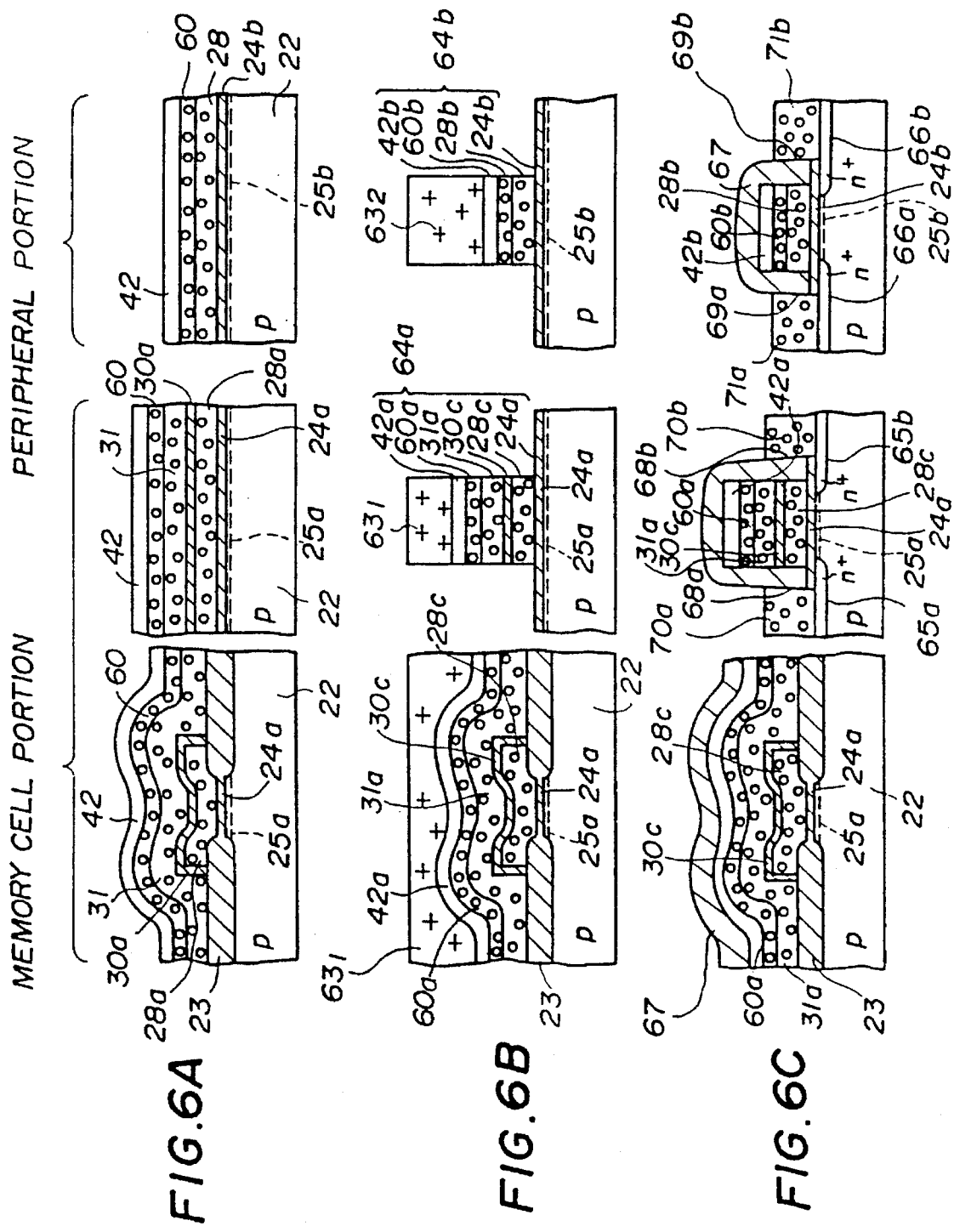
FIGS. 6(A)–6(C) are diagrams showing a fabrication process of a flash-EPROM according to a third embodiment of the present invention.

Referring to FIG. 6(A) corresponding to the step conducted after the step of FIG. 3(E), a polysilicon layer 60 is deposited on the structure of FIG. 3(E) and the polycide layer 42 described with reference to the previous embodiment is deposited further thereon. Thereby, the layer 60 forms a polycide at the interface to the underlying polysilicon layer 60. Next, a resist layer is deposited on the layer 60 and is patterned subsequently to form resist patterns $63_1$ and $63_2$, and the layer 60 as well as the layers located underneath are patterned by a reactive ion etching process that is conducted while using the resist patterns $63_1$ and $63_2$ as a mask. Thereby, the structure shown in FIG. 6(B) is obtained. In the structure of FIG. 6(B), it will be noted that the polysilicon layer 60 is patterned in correspondence to the memory cell transistor into a polysilicon pattern 60a formed above the control gate electrode 31a and the polycide layer 42 is patterned into a conductor pattern 42a in correspondence to the polysilicon pattern 60a. Similarly, the polysilicon layer 60 is patterned in correspondence to the peripheral transistor into a polysilicon pattern 60b formed above the gate electrode 28a and the polycide layer 42 is patterned into a pattern 42b formed above the pattern 60b.

Further, after an ion implantation process to form a source region 65a and a drain region 65b of the memory cell transistor as well as to form a source region 66a and a drain region 66b of the peripheral MOS transistor, a PSG film 67 is deposited as shown in FIG. 6(C), and contact holes 69a, 68b, 69a and 69b are formed similarly to the previous embodiments. Further, the contact holes are filled with polysilicon electrodes 70a, 70b, 71a and 71b, and the flash-EPROM is completed as shown in FIG. 6(C).

According to the present embodiment, it will be noted that one can use substantially dopant-free polysilicon for the polysilicon layer 31 by using a doped polysilicon for the layer 60. In addition, the high resistivity of the polysilicon layer 31 and hence the layer 31a is compensated for by the doped polysilicon layer 60 and the polycide layer 42. Thereby, the contamination of the capacitor insulation film 30c is minimized.

Next, a fourth embodiment of the present invention will be described with reference to with reference to FIGS. 7(A)–7(C). Similarly to the previous drawings, the illustration at the left and middle show the memory cell transistor under fabrication while the illustration at the right shows the peripheral transistor under fabrication.

Referring to FIG. 7(A), the polysilicon layer deposited in the step of FIG. 3(E) is left unetched, and thus, the peripheral transistor of the present embodiment has a structure similar to the previous embodiment in that the gate electrode includes a polysilicon electrode 31b in addition to the polysilicon electrode 28b. There, the electrode 31b is separated from the electrode 28b by a silicon oxide film 30b that in turn is formed from the silicon oxide film 30b as a result of the patterning.

In the present embodiment, in order to avoid the gate electrode 28b to form a floating electrode, the electrodes 28b and 31b are shunted at a contact hole 52b shown in FIG. 7(B), wherein such a contact hole 52b may be formed at a location offset from the plane of FIG. 7(A) in the upward or downward direction. In the embodiment of FIG. 7(B), the contact hole 52b is formed to expose the upper major surface of the field oxide region represented by a numeral 54. It should be noted that the field oxide region 54 corresponds to the field oxide region 23 formed in the step of FIG. 3(A) for device isolation. Thereby, the contact hole 52b is filled by a polysilicon wiring pattern 53b and the electrodes 28b and 31b are connected with each other electrically. In other words, the electrodes 28b and 31b function as a single gate electrode.

FIG. 7(C) shows a modification of the construction of FIG. 7(A), wherein it will be noted that the polysilicon electrode 31b is connected to the polysilicon electrode 28b by a contact hole 52b that exposes the electrode 28b. In this modification, too, the electrode 31b and the electrode 28b are shunted by a polysilicon wiring pattern 53b that fills the contact hole 52b.

Further, the present invention is not limited to the above described embodiments, and variations and modifications may be made without departing from the scope of the present invention.

What is claimed is:

1. A non-volatile semiconductor memory device, comprising:

a substrate defined with a first device region and a second device region;

a first gate insulation film provided on said substrate so as to cover said substrate in correspondence to said first device region, said first gate insulation film having a thickness so as to allow a tunneling of carriers therethrough;

a second gate insulation film provided on said substrate so as to cover said substrate in correspondence to said second device region;

a first electrode provided on said first gate insulation film;

a second electrode provided on said second gate insulation film;

a first dielectric film provided on said first electrode so as to cover an upper major surface and a side wall thereof, said first electrode thereby forming an isolated, floating electrode surrounded by said first gate insulation film and said first dielectric film;

a second dielectric film provided on said second electrode;

a third electrode provided on said first dielectric film;

a fourth electrode provided on said second dielectric film; and a contact hole provided on said second dielectric film for contacting said second electrode and fourth electrode electrically with each other;

said first and second electrodes having a substantially identical composition and thickness;

said third and fourth electrodes having a substantially identical composition and thickness;

said first and second dielectric films having a substantially identical composition and thickness;

said first gate insulation film, said first electrode, said first dielectric film and said third electrode forming thereby a memory cell transistor that store information in said first electrode in the form of electric charges;

said second gate insulation film, said second electrode, said second dielectric film and said fourth electrode forming thereby a peripheral transistor, wherein said contact hole exposes the surface of said second electrode, said second electrode and said fourth electrode establishing an electrical contact at said contact hole by a fifth electrode provided on said fourth electrode so as to fill said contact hole.

2. A non-volatile semiconductor memory device, comprising:

a substrate defined with a first device region and a second device region;

a first gate insulation film provided on said substrate so as to cover said substrate in correspondence to said first device region, said first gate insulation film having a thickness so as to allow a tunneling of carriers therethrough;

a second gate insulating film provided on said substrate so as to cover said substrate in correspondence to said second device region;

a first electrode provided on said first gate insulation film;

a second electrode provided on said second gate insulation film;

first dielectric film provided on said first electrode so as to cover an upper major surface and a side wall thereof, said first electrode thereby forming an isolated, floating electrode surrounded by said first gate insulating film and said first dielectric film;

a second dielectric film provided on said second electrode;

a third electrode provided on said first dielectric film;

a fourth electrode provided on said second dielectric film; and a contact hole provided on said second dielectric film for contacting said second electrode and fourth electrode electrically with each other;

said first and second electrodes having a substantially identical composition and thickness;

said third and fourth electrodes having a substantially identical composition and thickness;

said first and second dielectric films having a substantially identical composition and thickness;

said first gate insulation film, said first electrode, said first dielectric film and said third electrode forming thereby a memory cell transistor that store information in said first electrode in the form of electric charges;

said second gate insulation film, said second electrode, said second dielectric film and said fourth electrode forming thereby a peripheral transistor wherein said contact hole is provided so as to penetrate through said second and fourth electrodes and said second dielectric film, said second and fourth electrodes establishing an electrical contact at said contact hole by a fifth electrode provided on said fourth electrode so as to fill said contact hole.

* * * * *